(12) United States Patent
Luitwieler (10) Patent No.: US 6,912,489 B1
(45) Date of Patent: Jun. 28, 2005

(54) SIMULATION DEVICE FOR SIMULATING IMAGES OF AT LEAST ONE BUILDING

(75) Inventor: Adriaan Luitwieler, Amsterdam (NL)

(73) Assignee: Aluvisions B.V., Almere (NL)

( * ) Notice: Subject to any disclaimer, the term of this patent is extended or adjusted under 35 U.S.C. 154(b) by 0 days.

(21) Appl. No.: 09/647,551

(22) PCT Filed: Mar. 31, 1999

(86) PCT No.: PCT/NL99/00192

§ 371 (c)(1),
(2), (4) Date: Nov. 27, 2000

(87) PCT Pub. No.: WO99/50769

PCT Pub. Date: Oct. 7, 1999

(30) Foreign Application Priority Data

Mar. 31, 1998 (NL) ............................................. 1008767

(51) Int. Cl.⁷ .............................................. G06F 17/50

(52) U.S. Cl. ....................... 703/1; 703/7; 52/29; 52/32; 52/93.2; 52/272; 434/79; 434/72

(58) Field of Search ............................. 703/7, 1; 52/29, 52/32, 93.2, 272; 434/79, 72; 345/619, 646; D25/7, 199

(56) References Cited

U.S. PATENT DOCUMENTS

| | | | |
|---|---|---|---|
| 4,964,060 A | | 10/1990 | Hartsog |
| 5,557,537 A | * | 9/1996 | Normann et al. ............... 703/1 |
| 5,655,087 A | * | 8/1997 | Hino et al. .................... 705/29 |
| 5,761,674 A | * | 6/1998 | Ito ........................... 707/104.1 |
| 6,014,503 A | * | 1/2000 | Nagata et al. ................. 703/1 |

OTHER PUBLICATIONS

By K. Papamichael et al., "Building Design Advisor: automated integrationof multiple simulation tools", *Automation in Construction*, vol. 6, No. 4, Aug. 1997, pp. 341–352.

By R. Sacks et al., "A project model for an automated building system: design and planning phases", *Automation in Construction*, vol. 7, No. 1, Dec. 1997, pp. 21–34.

By K. McKinney et al., "Visualization of Construction Planning Information", *IUI 98 International Conference on Intelligent User Interfaces, Proceedings of 1998 International Conference on Intelligent User Interfaces*, San Francisco, CA, Jan. 1998, pp. 135–138.

By D. Kurmann et al., "Real–Time Modeling with Architectural Space", *CAAD Futures 1997—Proceedings of the 7th International Conference on Computer Aided Architectural Design Futures, Proceedings of 7th International Conference on Computer Aided Architectural Design Futures CAAD Futures*, Munich Germany, Aug. 1997, pp. 809–819.

By H. Raad et al., "Visualisation of Building maintenance through time", *Proceedings—1997 IEEE Conference on Information Visualization*, Los Alamitos, CA, Aug. 1997, pp. 308–314.

By A. Mahdavi et al., "Towards Computational Eco–Analysis of Building Designs", *Information Processing in Civil and Structural Engineering Design*, Aug. 1996, pp. 141–150.

\* cited by examiner

*Primary Examiner*—Anthony Knight
*Assistant Examiner*—Thomas Pham
(74) *Attorney, Agent, or Firm*—Young & Thompson (57) ABSTRACT

A simulation device for simulating images of at least one building includes a display (62) for displaying the images; an input (63, 64) for a user to input data; a memory (65) including a first memory field containing a layout (40) of the at least one building, which layout (40) contains references to all the utility spaces forming the layout, together with their performance characteristics, a second memory field containing a model (50) of the at least one building, which model (50) contains references to both physical and financial data of all the components forming the model, a processor (61) for: computing and showing elevations of and/or sections through the building, working from the layout of the model; calculating and showing the total expected investment costs and running costs for the building.

7 Claims, 5 Drawing Sheets

Fig 5

SIMULATION DEVICE FOR SIMULATING IMAGES OF AT LEAST ONE BUILDING

BACKGROUND OF THE INVENTION

The invention relates to a simulation device for generating images of at least one building.

Such simulation device for generating images of at least one building is known from R. Sacks e.a., "a project model for an automated building system: design and planning phases", automation in construction, 7 (1997), pages 21–34. Sacks e.a. disclose an automated building system used to design and support constructing of a building project, from its conceptual phase to its construction. The automated building system comprises a project model using three object hierarchies: for the representation of spaces, for representation of functional systems in these spaces, and for an installation by appropriate activities. Three levels of spaces are defined: building, primary spaces and secondary spaces.

The building is defined by properties like: lay-out on site, elevation, number of floors, list of primary spaces, functional system requirements, list of building assemblies and area.

The primary spaces are building floors, shafts of elevators, etc. The primary spaces are defined by properties like: spacename (floornumber), function, area, height, list of functional systems and their requirements, list of the floor work assemblies and lay out. Functional systems are for instance exterior enclosures, space dividers, structures, lighting, plumbing, etc. The work assemblies relate to the materials used for these functional systems, e.g., masonry of concrete blocks and mortar, gypsum boards on timber stud etc.

Secondary spaces are subdivisions of the primary spaces and will usually relate to rooms or other areas with distinctive performance requirements. Secondary spaces are defined by properties like: location on the floor, function, lay out, area and specific performance requirements.

A device of similar nature is known from K. Papamichael, "Building Design Advisor: automated integration of multiple simulation tools", Automation in Construction, 6 (1997), pp. 341–352. The device comprises a computer provided with software to assist a designer of buildings during the design process, starting from the first draft design phase all the way through to the detailed entry of components employed. The known device uses a single user interface. The computer provides the user with the possibility of specifying a building which is to be designed in terms of actual objects, such as floors, walls, building sides, etc. For example, the user draws a room, and the computer program then automatically generates wall, ceiling and floor objects, together with standard values which, if necessary, can subsequently be altered by the designer.

The drawback of the existing device is that it only allows the user to position components which are to form the building directly at a specified location in the simulated module. The known software operates at the level of the concrete hardware components.

A further drawback is that it is not possible to visualize changes to the building over time. For example, it is not possible to record how a certain air volume changes with time from the moment at which construction is begun all the way through to completion. In other words, the program does not offer any assistance with construction planning, but only provides a simulated model of the end result.

It is usual, when constructing buildings, for various steps to be fixed over the course of time. The first phase is usually to record the requirements of end users, resulting in a program of requirements (PoR). Then, the architect usually makes a model, in the form of drawings, of the building to be constructed. Sometimes, the architect also makes a scale model. Then, preparations for actual construction begin, and after that construction itself will take place.

Currently, however, a building process is relatively often liable to be modified considerably. The objectives which were formulated at the outset are very often changed considerably during one of the phases of the construction process. This fact places considerable demands on the way in which a process is carried out, since any change during a certain phase of the process has consequences for the following steps of the process.

The underlying principle of cybernetics is that a preset objective may be modified at any time and this principle has over the years become well-established in modern industry.

In the construction industry, it is necessary to be able to respond to changing requirements of end users of a building more flexibly than has hitherto been the case. It is also necessary, before the actual construction of a building begins, to improve the likelihood that the building to be constructed will actually satisfy all the formulated requirements.

The object of the present invention is to provide a simulation device with which this can be achieved.

SUMMARY OF THE INVENTION

Using a simulation device of the present invention it is possible, before even a single brick of the building to be newly constructed or the building to be adapted has been put in place, to simulate the building in use, including the associated costs. All the functions which are required for the prospective building are inventoried beforehand and are computed for each utility space and stored in memory means. The functions and requirements are recorded by coupling them to the layout of utility spaces, providing an additional layer of information without selecting concrete (hardware) components. This means that air spaces in the layout can be rearranged as desired without there being any consequences for the (hardware) components. Moreover, the requirements and functions can be changed flexibly, since at the level of the layout they are not yet linked to (hardware) components. Only when agreement has been reached concerning these elements at the level of the layout do concrete components have to be added to the model. A simulation device of this nature, with a separation between a layout at the level of air spaces for specified applications with specified requirements and a model containing concrete components can therefore be used to flexibly improve the design of the building.

Within the context of the invention, the term "utility space" is used with a special meaning. If, for example, someone wants to have 1 table with 4 chairs and a desk with a desk chair in his/her office, the minimum utility space for that office is defined as the sum of the minimum utility space for 1 table with 4 chairs and a desk with a desk chair. The utility space of a desk chair is defined as the 3-dimensional volume which is required for the office chair during use by the user. Therefore, the utility space also comprises air space in which the desk chair is to be able to move when the user is to sit down on the desk chair and is to push it towards the desk. This utility space must be available for the desk chair and must not be taken up by the utility space of another component.

Thus, utility spaces are also defined, for example, for walls, doors, windows, etc. For doors too, the utility space is larger than the space which the door physically takes up. Something similar applies to a gallery. If a gallery is desired, it is necessary to define a three-dimensional utility space for this gallery (for example between two floor levels), and this space can no longer be used for anything else.

In a preferred embodiment, the processor means are designed to calculate whether the utility spaces defined in the layout are situated in overlapping locations and, if this is the case, to generate a warning signal. It is thus possible, even before actual construction has commenced, to prevent the need to adapt the design during construction, resulting from the design of the building having conflicting features. For example, by defining the position and volume required for an entry to an underground garage, it is possible to prevent this entry subsequently overlapping with the position of a basement of specified dimensions.

In another preferred embodiment, the processor means are designed to calculate whether, for each utility space, the specified performance characteristics can be satisfied, making use of the component cards relating to the utility space in question. It is thus possible to continuously check whether the building satisfies the desired requirements.

In another embodiment, the processor means are designed to display a 3-dimensional display, comprising successive images of elevations of a building over the course of time, via display means. Using such a real-time, three-dimensional display, it is possible, as it were, to walk through or around the simulated building in order to obtain the best possible impression of how the building will look. The result is a virtual display with which it is possible to move through the model live, in real time and true to scale. In the process, the user of the simulation device may, if desired, make all kinds of changes, such as the position of radiators in a room, the position of support columns, the colour of the walls, the size of windows, etc. It is therefore possible, even before the building has actually been constructed, for a user to obtain a reasonably reliable picture of the building which is to be constructed. For example, it is possible to consider whether the building is at the correct position, i.e. whether it fits in with the surrounding area.

BRIEF DESCRIPTION OF THE DRAWINGS

The invention will be explained in more detail below with reference to several drawings, which are not intended to limit the inventive idea but merely to illustrate it. In the drawings.

DESCRIPTION OF THE PREFERRED EMBODIMENTS

Figure 1:
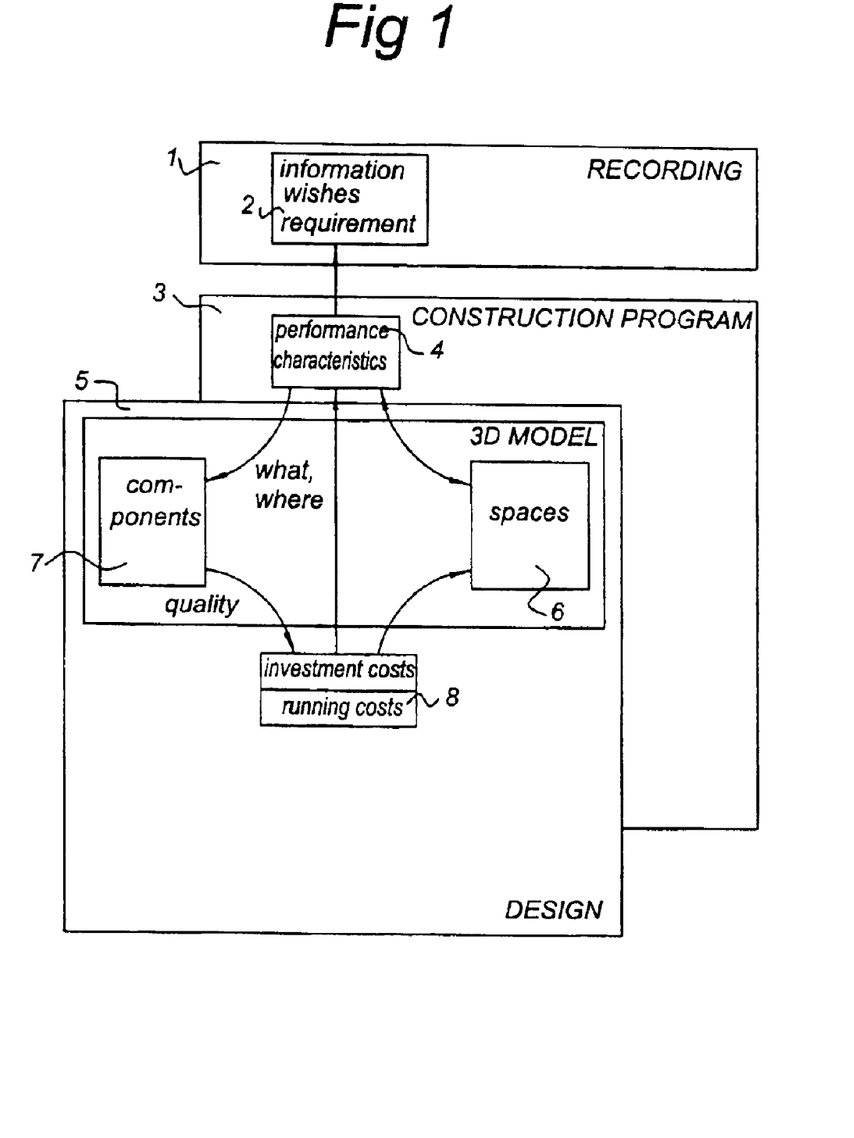
FIG. 1 shows three steps during the initial phase of development of a building.

FIG. 1 shows various steps which are taken in order to produce a model of a building. There are three successive steps in FIG. 1: recording 1, construction program 3 and design 5. The aim of the three steps mentioned is to contribute to producing a building which functions correctly in all respects. For this purpose, in the phase comprising building program 3, a building is simulated in use, including the associated costs. All the functions which are required in the prospective building are inventoried and linked to a layout and their mutual relationships are shown. The costs to be incurred are also calculated, both with regard to investment and with regard to running. This assembly of functions and costs is accommodated in the "construction program 3" step.

During the recording phase 2, all those groups which have an interest in the construction of the building in question can formulate information, wishes and requirements. This will be dealt with in more detail below.

During the construction program phase 3, the performance characteristics 4 of the building to be constructed, which correspond to the information, wishes and requirements 2 which have been expressed during the recording phase 1, are input to a computer simulation program. In the process, the wishes and requirements are translated into a layout of utility spaces required, each of which must satisfy the performance characteristics defined above. In this sense, the layout represents a reservation of various volumes for various purposes and their respective positions.

During the design phase 5, a computer is used to produce a three-dimensional model of the building. The three-dimensional model comprises the actual components 7 which shape the layout of the building, such as partitions, doors, windows, supporting walls, tables, chairs, etc., at a specified position.

As will be explained in more detail below, the choice of certain components 7 has consequences for the total investment/running costs 8. The higher the quality of the components selected, the higher the investment costs, for example, may be, but sometimes the running costs are reduced accordingly. As indicated by arrows, the investment/running costs 8 are related to the performance characteristics 4, since the performance characteristics determine, for example, how expensive the overall building will be and how high its running costs will be. There is thus a link to the construction program 3.

The invention provides an interactive program with which, in a simulated model, both utility spaces and components can be changed and with which the overall performance of the building to be constructed can be monitored continuously. The performance characteristics of a building relate, for example, to dimensions for transportation of goods, temperature, light, etc., as will be explained in more detail below.

Figure 2:
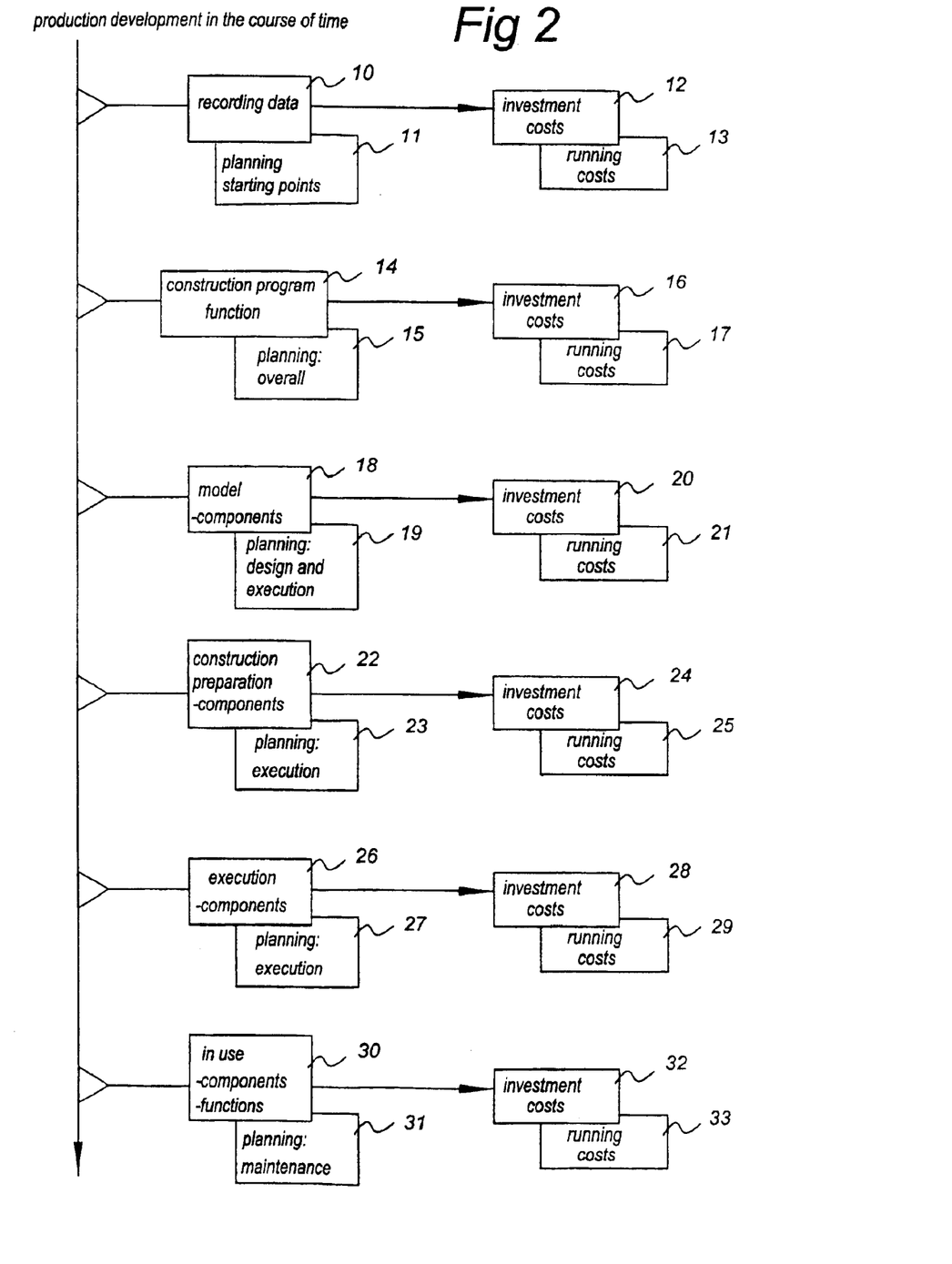
FIG. 2 shows six steps from the beginning to the end of development of a building.

FIG. 2 shows, over the course of time, the successive steps which are required in order to obtain a functioning building. The first step 10 is the recording of information, wishes and requirements, corresponding to step 1 from FIG. 1. This is associated with a section comprising planning 11 and formulation of the starting points.

The second step 14 is setting up the construction program 14, corresponding to step 3 in FIG. 1. This also includes a general plan 15 of the building to be constructed.

The third step 18 relates to making a model, which corresponds to step 5 in FIG. 1. This includes the planning 19 of the design and the execution.

The fourth step 22 is to prepare for the actual construction and to specify associated components and their treatment. This also includes a section comprising 3D planning 23 of the execution. This also includes specifying utility spaces required during construction, for example for the supply of construction materials, the material and the working space for construction workers.

The actual execution takes place in step 26, in which the components are put in place. The execution is continuously planned, step 27.

After the building has been completed, the use phase 30 starts, in which the components are used for the intended purpose. In this phase, facilities management has to take place, step 31.

The aim of facilities management is to offer space to users for a specific function while maintaining desired performance levels for the function in question. Desired performance levels may change over the course of time. When the use of a specific space changes, higher demands may, for example, be placed on the level of light and other performance characteristics. Certain investments are made in order to achieve a specified performance level. Components are put in place, for example a light fitting in order to achieve a light level of 400 lumen. This produces specific running costs, since the investment made can be written off while interest has to be paid for capital which has been used. Technical maintenance, cleaning maintenance, energy consumption, water consumption and insurance, taxes, inspections and monitoring, etc. have to be paid. All this requires planning with regard to the procurement of materials and equipment, as well as the use of labour. Ultimately, this leads to a workplace planning. The workplace planning includes, for example, the days on which a windowcleaner will be working in a finished building, authorized by the building management service and monitored, for example, by a security service. An administration section will take care of payment and be responsible towards the user for the finished building. It is then possible to assign costs for each work station.

Other examples of planning work are the activities which are required in the event of internal office moves, the replacement of components and the maintenance of components.

From the above it will be clear that all of phases 10, 14, 18, 22, 26 and 30 involve planning. In practice, this means that the simulation device according to the invention is provided with means for recording in the 3D-model, for each utility space and during each of the said phases, the period for which this utility space is situated at a specified location, which location therefore is then unavailable for any other utility space. During the construction preparation, it is possible, for example, to record the work involved for an architect to draw up a design, and during construction it is possible to record the location where a bricklayer is working, together with his materials and flow of materials; or else, during the "in use" phase 30, utility space can be reserved for washing the windows on every first Monday of the month.

The strength of the present invention is that simulation (virtual prototyping), via the model containing a database structure, is organized in such a manner that everything takes place within one system of arrangements, from the impetus to construct (parts of) a building through to demolition of a building.

It should be noted that within the context of the invention the word "building" must be interpreted sufficiently broadly: the word is also intended to include, for example, "an infrastructure project" involving road building and hydraulic engineering work. For example, the word may also encompass a ship.

During all the abovementioned phases, which are shown in FIG. 2, there is a relationship with investment/running costs. The investment/running costs are indicated in FIG. 2 by blocks 12, 13, 16, 17, 20, 21, 24, 25, 28, 29, 32 and 33.

The steps from FIG. 2 form the background for the following text.

Table 1 shows examples of the wishes, information and requirements stipulated during the recording phase 10. The list compiled in Table 1 is not intended to be exhaustive. Nor is it the case that all the points listed in Table 1 must always play a role for any building which is to be constructed. Table 1 shows those points which for most buildings are sufficient when filled in during the recording phase.

The various points from Table 1 may, for example, be filled in using a simple word processor. There is no particular need for coupling and testing with respect to further steps in the process. However, it is possible to fill in the points shown in Table 1 in such a manner that they are automatically linked to the performances of the building to be constructed, which will be discussed in more detail below with reference to FIG. 3 and Table 2.

After the recording phase 10 has been concluded, the construction program phase 14 begins.

Contradictory and unstructured wishes and requirements are often formulated in the recording phase 10. They are translated into the optimum solution which can be achieved for a particular user at a defined location. Thus the user is provided with a simulation of the building to be constructed, allowing him/her to answer questions such as:

is there sufficient room for all the work the company is required to carry out?

do all the performance levels of all the functions satisfy the requirements set?

what are the costs, both in terms of investment and in terms of maintenance?

what is the time frame within which all this can be achieved?

Figure 3:
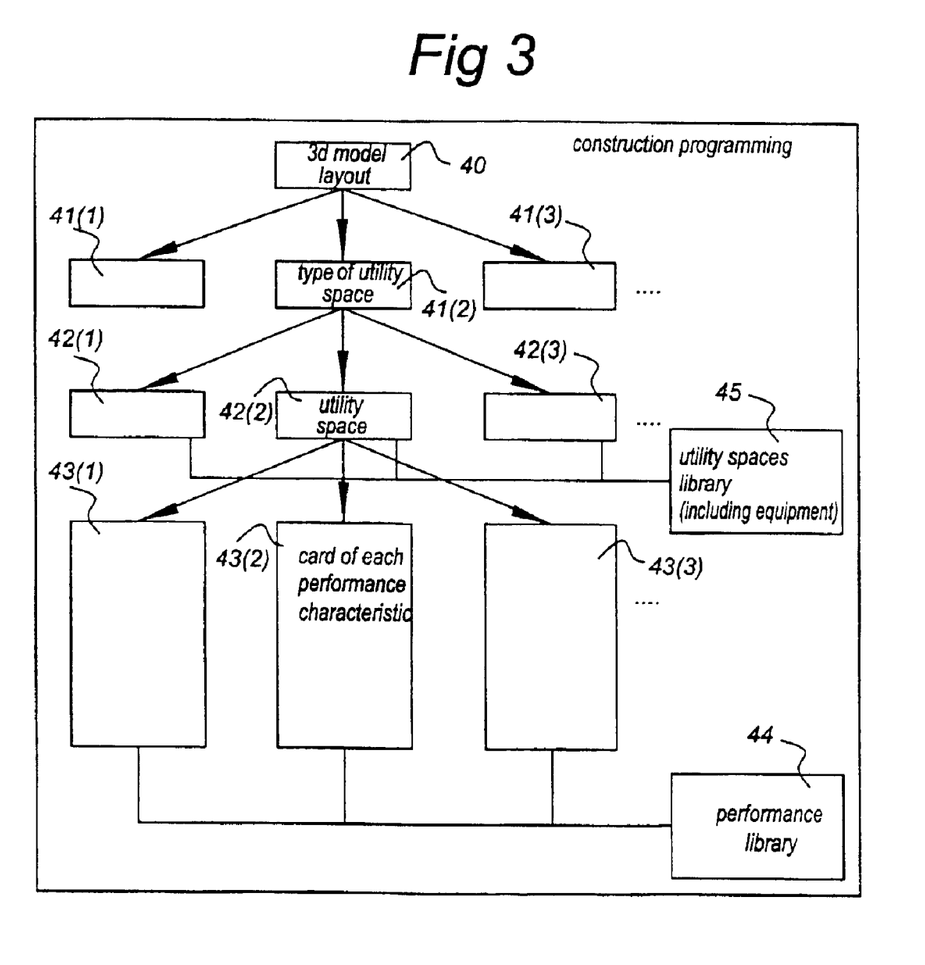
FIG. 3 shows the memory structure according to the invention for storing data relating to all the areas of a building, which together form the layout of the building.

FIG. 3 provides a more detailed explanation of a data structure for the layout of a building to be constructed, Note that the "layout" is not yet a "model" of the building to be constructed, but rather is a name for the set of specified utility spaces as defined above. The "model", which will be explained below with reference to FIG. 4, comprises only the physical components, such as wall, doors, etc. In the "layout", only necessary air volumes are defined and reserved within a three-dimensional positioning arrangement. For example, in the "layout" a meeting corner of a room is still nothing more than a defined volume of air at a stipulated location. Which physical components are used in or to delimit this volume of air is at this stage still irrelevant. The "hardware" components are only filled in later, during the model phase 18. This provides a designer with a considerable freedom to make changes to the layout, since such changes at that level do not yet have any direct consequences for the physical components themselves.

Figure 5:
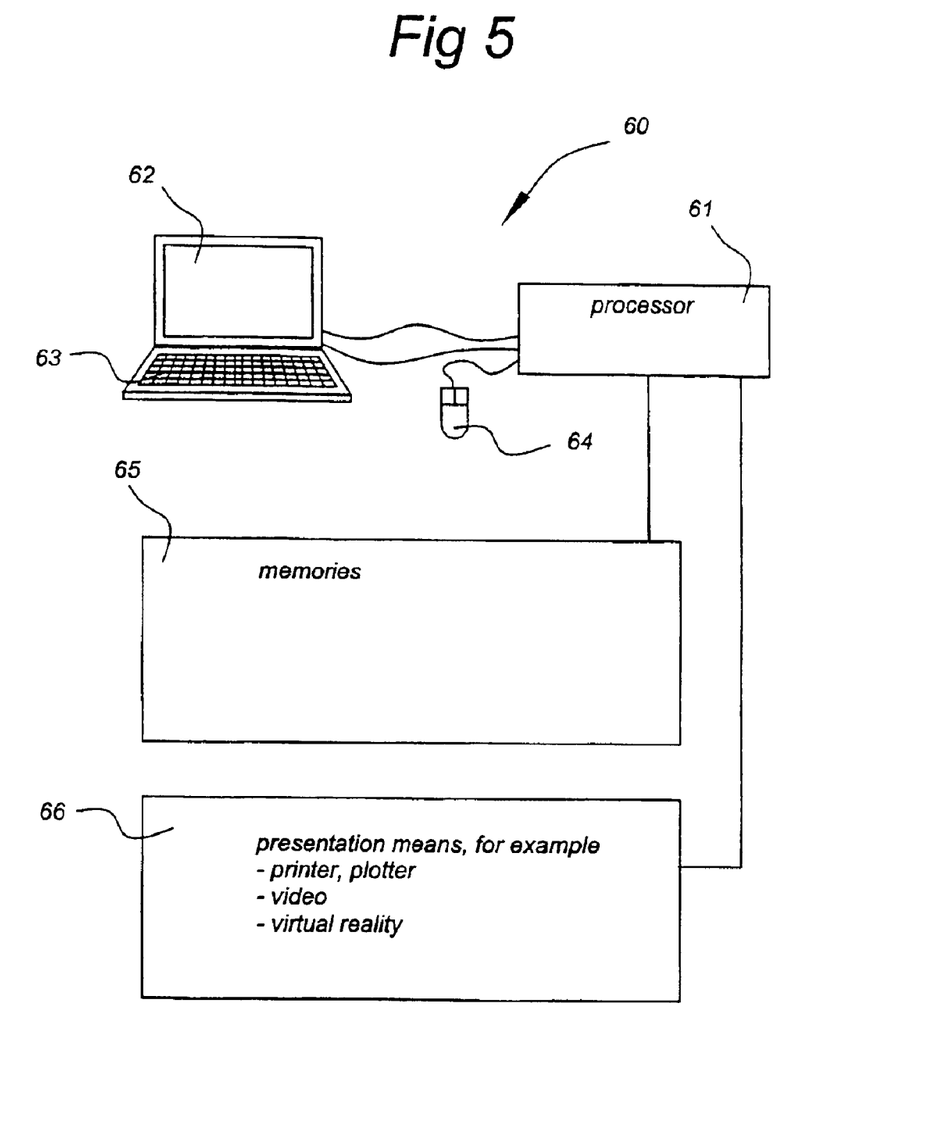
FIG. 5 shows a diagrammatic arrangement of the device according to the invention.

The data structure shown in FIG. 3 is built up in the memory of a computer (not shown in FIG. 3) for the purpose of the simulation program. FIG. 5 shows an arrangement, in diagrammatic form, of a computer which can be used to implement the invention. The arrangement shown in FIG. 5 contains a processor 61, which is connected to a monitor 62, a keyboard 63, a mouse 64, memories 65 and presentation means 66, such as a printer, plotter, video, means for generating virtual reality images. In accordance with the invention, the space model, the layout 40, is firstly divided into various types of utility spaces 41(1), 41(2), 41(3), . . . The utility spaces often form a cluster in the model, for example as a layer containing offices or bedrooms in a hospital. Ultimately, however, the model is the sum of separate utility spaces 42(1), 42(2), 42(3), . . .

In order not to have to reformulate optimum spaces each time, a utility space library 45 is provided, in which data relating to known types of utility spaces are stored. The data can be retrieved from the utility space library 45 and can be fitted in the layout by the user in the form of specific utility spaces 42(1), . . . Since the furnishings are required in the utility spaces, for example tables, chairs or beds, are one of the factors which determine the air space required for a certain activity, it is preferable for these furnishings, together with the air space required for it, to be stored in three-dimensional form in the utility space library 45. Thus, the utility space library may, for example, include information relating to the air space required for a normal toilet and for a disabled toilet. A different air space will be defined for both types of toilet.

Performance cards 43(1), 43(2), 43(3), . . . are linked to the defined utility spaces 42(1), . . . Preferably, a performance library 44 is provided, in which known data relating to specific performance characteristics are stored. From this performance library, a user can read information and store it in the memory in suitable form as a performance card for a specific utility space.

A list containing performances is given in Table 2. Performance examples are the comfort of the space (for example subdivided into heat comfort, light, psychological comfort and hygiene) and safety and security (for example subdivided into fire prevention, theft prevention and access control to the space).

The layout of the three-dimensional model with the associated performance characteristics for each utility space ultimately forms an optimum solution which can be achieved for the user of a building at a specific location, together with an estimation of costs and time frame. A time frame of this nature means that for each air volume is stipulated, in the memory of the device shown in FIG. 5, the period for which any utility space occupies the said air volume.

An example is:

The third field is an indication of the floor on which the space in question is situated. In the example given above, it is possible to define nine levels beneath the ground floor and ninety-nine floors above the ground floor. In the example given above, the space in question is situated on the first floor (code 01). In the last field, it is possible to specify in which wing of the building the space is situated. It is also possible to specify a further subdivision for each wing.

A performance card 43(1) . . . for all the specified performance characteristics is provided for each utility space which has been coded in this way. For example, for the "light" performance, it is specified how much daylight the utility space in question will receive. The minimum lux level required on the desk of a user in the said utility space will also be specified. This value may, for example, be 350 lux. For this purpose, it is then specified that such a level of light must be present as daylight on the desk for a period of, for example, 75% of the working hours, corrected for summer time. Having been given the orientation of the utility space in question and the window area available with respect to the sun, as well as the geographic position of the building on the Earth, it is possible to automatically calculate whether such a requirement can be met throughout the year. If the calculations show that such requirements cannot be met using daylight, it is possible to warn the user of the simulation program that the requirements which he/she has set cannot be achieved. The designer will then have to take countermeasures. He/she may, for example, increase or move the window surface or may introduce more artificial light into the space, so that the requirements will then be satisfied.

A level name has, for example, the following structure:

```
SD_K_01_1..
         |
         |     1..: Wing number or orientation
         |     1: if there are so many components in a wing that
         |        the "project name" becomes full, two positions
         |        remain for subdividing according to space
         |        number
         |
         |     01 = Floor
         |         _0:     Foundations
         |         ¯9−_1:  Basement levels
         |         00:¯    Ground floor
         |         01–99:  Upper Floors
         |
         |     P = Part of building
         |         O: Offices
         |         H: WareHouse
         |         W: Workplaces
         |         R: Roof
         |         G: Parking Garage
         |         S: Site
         |         (These are to be defined for each project)
         |
         |     SD = Phase
               PR: Construction PRogram
               SD: Sketch Design
               PD: Preliminary Design
               FD: Final Design
               CO: COntract documents
```

```
N_0_GF
      |
      |    Input these spaces; for the time being, all bear the code
      |    GO. For the time being, all the components to be postioned
      |    are to be input with the code GF (Groos Floor area). When
      |    calculations are required, assign in accordance with
      |    NEN 2580 (cf. Table 3)
      |
      |    Begin by inputting everything with code 0.
      |    1 to 9 inclusive available
      |    Whenever calculations are required, split up in order to be
      |    able to produce separate measurement statements. Separate
      |    measurement statements may be desired for cost
      |    calculations when using different end costs or when splitting
      |    between investors (e.g. owner, tenant)
      |
      |    N = Status of the volume
           E: Existing
           D: Components or rooms to be Demolished
           B: Bare: whatever remains after demolition
           A: Utility spaces or components to be Added
           N: New status
```

This coding system comprises four fields. The first field is a reference to the phase in which the design is currently situated. In the example, this phase is SD, which stands for Sketch Design.

The second field defines a utility space. The example selected here is the space O, which stands for Offices. It is then specified for each office, for example, how many utility spaces of the "workroom" type are required. It is then specified for each workroom how many utility spaces of the types "desk chair", "desk", "conference table", "conference chair", etc. types are required.

As stated, the first parameter of this code is a reference to the status of the volume in question. The second parameter is a number which does not in itself involve a maximum. The numbers employed refer to various types of measurement statements. For example, the number zero can be used for additional costs, i.e. those costs which are collectively required for a construction project, including, for example, providing a site hut for the contractors.

The third parameter represents a classification according to type of surface, for example in accordance with standard NEN 2580, which is given here in Table 3.

Figure 4:
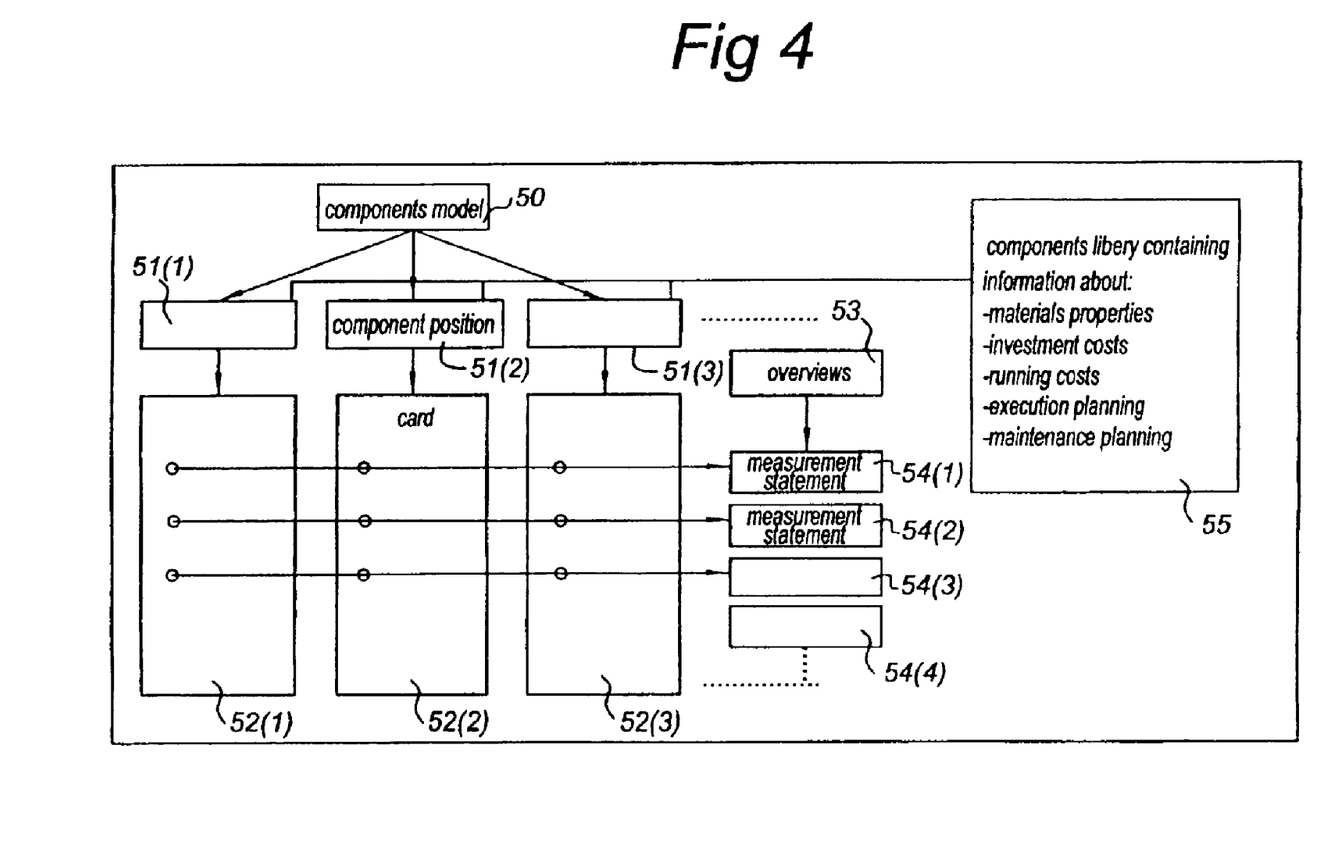
FIG. 4 shows a memory structure according to the invention relating to all the components which form part of the simulation model.

After the layout of the building to be constructed has been produced in accordance with the structure of FIG. 3, a simulation model of the building to be constructed is made in accordance with the structure of FIG. 4. All the necessary components are linked to the model 50, in the form of component positions 51(1), 51(2), 51(3), . . . A component position is a location, for example in the form of x, y, z coordinates of a corner of the component in question relative to a selected origin.

Here too, according to the invention, a construction component is placed in a required air space. Data relating to known construction components are present in a component library. The significant advantage of this is that the design can be worked out from broad all the way through to detailed. The 3D model can also be used to check that specific volumes do not intersect one another and/or adjoin one another and that all the mutually adjoining stages with their specific data structure can be linked to the air space.

The component library 55 has, for example, a structure in which data relating to the air space allocated to a component are stored, such as:

materials properties for making calculations;

investment costs;

running costs;

execution planning;

maintenance planning.

Each component position 51(1), 51(2), 51(3), . . . has a card 52(1), 52(2), 52(3), . . . with measurement statements, as shown in FIG. 4. The measurement statements 54(1), 54(2), 54(3), 54(4) provide a global overview of the component at the component position in question. By way of example, the following measurement statements are defined in each card:

the type of component; for this, the so-called STABU code, for example, is used; this code is given in Table 4 at the end of this description. In total, 256 codes, for example, are available, and these can also be referred to as the layer number, running from 1 to 256 inclusive. Layer 1 is reserved for passages and layer 256 for auxiliary components, as can be seen from the said table. To display the various types of components, it is preferable to select a different colour for each component, so that the user can recognize the type of component direct from the colour when displayed on a screen. For example, external walls bear the STABU code 231100 and, according to the table, correspond to layer number 57 and colour 57;

the date on which the component was placed in the simulation model;

the type of material the component is made of;

the number of man hours required to install the component during construction;

the materials costs; and the running costs.

FIG. 4 therefore shows a memory structure for the simulation model 50 of a building to be constructed in the form of type components, their positions and associated costs, both with regard to investment and running. On this basis, therefore, it is subsequently easy to provide total overviews of total investment costs and total running costs, by simply adding the individual investment costs and running costs. To this end, the processor 61 is provided with suitable adding means, for example in the form of suitable software.

Therefore, the memory furthermore comprises all the data which are important for planning all the desired activities relating to the building, for example hours which are required to install a component during construction or to maintain the component after construction has been completed. These time data are linked to the utility space which people require in order to carry out an activity relating to the component. In this sense, a 4D (4-dimensional=space+time) model is involved. Sometimes, components are only present temporarily, for example if they form part of a site hut required for construction or if they are to disappear from the building as a result of renovation. In that case, it is recorded in the memory that a component of this nature is present at a certain location only until a certain time. It is thus possible to avoid conflicts in planning different activities at the same location over the course of time.

The simulation model shown in FIG. 4 therefore comprises all the data for all the components which will be installed during construction. The processor 61 is provided with suitable means, for example in the form of software, to check whether the combination of components and component positions provide the performance characteristics desired. For example, it is easily possible to check automatically whether a specific workroom is able to receive a specified quantity of light, by adding up the expected daylight and the maximum artificial lighting level which can be achieved. The daylight level may, for example, be calculated using simple formulae, if the surface area of the "windows" components and their position with respect to the sun are stored in the model. The same applies to, for example, the temperature. Using formulae which are known per se, it is easy to calculate whether a specific workroom can, for example, be kept at 20° C. throughout the year, given the external temperature, the type of "walls" components, the type of "floor" components and the type of "ceiling" components, the output of the "radiator" and "air-conditioning" components.

In order to be able to control the simulation model, a control model is preferably also stored in the memory 65 of the computer 60. This control model then contains control cards for each space, which cards contain, for example, the following parameters:

the performances per utility space corresponding to the appropriate performance cards 43(1), 43(2), . . . (FIG. 3);

component information corresponding to the component cards 52(1), 52(2), . . . (FIG. 4);

fixed costs;

energy costs;

technical maintenance;

cleaning costs;

administrative management costs;

other operating costs;

organization

The control model can, in principle, be extended to form a complete facility management, including authorization as to who may request or modify what information at what time and use it for external purposes.

The processor 61 is equipped with a drawing design program which has access to the information contained in the memory 65. Drawing design programs which are known per se may be used for this purpose. In a known drawing design program of this nature, the position from which a section is to be shown on the screen 62 can be defined. It is thus possible, as it were, to define the position of a "camera" and the position of the objective. It is also possible to define the scale of the drawing, as well as the type of drawing, for example "section" or "elevation drawing". Both horizontal and vertical sections can be shown.

The drawing design program of the STAR mentioned above may, for example, be used as the drawing design program.

A special option for the processor 61 is to display various sections through the model in succession over the course of time on the screen 62, so that a user looking at the screen 62 can, as it were, walk through the model. To do this, a user specifies a number of camera positions on a line which he/she has defined, as well as the objective which the camera is to view from the specified positions. The processor is designed in such a manner that it is able to display the various sections involved in this process in succession over the course of time.

It is also possible to make the data stored in the memory 65 available for a three-dimensional display, so that a user has an even better impression of walking through a real building. Three-dimensional simulators of objects are known per se. For example, one such three-dimensional simulator is provided at the Stichting AcademischReken-centrum Amsterdam [University Calculation Centre Institute of Amsterdam] (SARA) in Amsterdam.

TABLE 1

RECORDING
TABLE OF CONTENTS

| | |
|---|---|
| 1 | USER PROGRAM (including future expectations) |
| 1.1 | User category |
| 1.1.1 | User functions |
| 1.1.2 | Arrangement in a layout |
| 1.1.3 | Optimization for the future |
| 1.2 | Production |
| 1.2.1 | Separate processes |
| 1.2.2 | Performance requirements |
| 1.3 | Movements of people |
| 1.3.1 | External |
| 1.3.2 | Internal |
| 1.4 | Movements of goods |
| 1.4.1 | External |
| 1.4.2 | Internal |
| 1.5 | Communication |
| 1.5.1 | External |
| 1.5.2 | Internal |
| 2 | Location |
| 2.1 | Construction conditions |
| 2.1.1 | Land register |
| 2.1.2 | Development plan |
| 2.1.3 | Building regulations |
| 2.1.4 | Population |
| 2.1.5 | Nuisance Act/environment |
| 2.1.6 | Water management authorities |
| 2.1.7 | Fire prevention |
| 2.1.8 | Labour inspection |
| 2.2 | Facilities in the surrounding area |
| 2.2.1 | Social facilities |
| 2.2.2 | Commercial facilities |
| 2.3 | Ground data |
| 2.3.1 | Soil conditions |
| 2.3.2 | Groundwater |
| 2.3.3 | Complications with adjoining plots |
| 2.3.4 | Foundation remains |
| 2.4 | Existing buildings |
| 2.4.1 | Retain |
| 2.4.2 | Demolish |
| 2.5 | Earth-moving options |
| 2.5.1 | Dumping on site |
| 2.5.2 | Temporary storage |
| 2.5.3 | Removal |
| 2.5.4 | Supply |
| 2.6 | Infrastructure |
| 2.6.1 | Public transport services |
| 2.6.2 | Private transport |
| 2.6.3 | Roads network |
| 2.6.4 | Communications |

TABLE 1-continued

RECORDING
TABLE OF CONTENTS

| | |
|---|---|
| 2.6.5 | Energy |
| 2.6.6 | Water |
| 2.6.7 | Sewerage |
| 2.6.8 | Large refuse |
| 3 | PLANNING |
| 4 | ECONOMICS |
| 4.1 | Maintenance |
| 4.2 | Charges/subsidies |
| 4.3 | Property tax |
| 4.4 | Initial costs |
| 4.5 | Financing |
| 4.6 | Depreciation |
| 4.7 | Purchase of land |
| 4.8 | Lease |

TABLE 2

CONSTRUCTION PROGRAM
LIST OF PERFORMANCE CHARACTERISTICS

| | |
|---|---|
| 0 | INTRODUCTION |
| 1 | COMMUNICATION |
| 1.1 | Movements of people |
| 1.1.1 | External |
| 1.1.2 | Internal |
| 1.1.3 | Window cleaner |
| 1.2 | Movements of goods |
| 1.2.1 | External |
| 1.2.2 | Internal |
| 1.2.3 | Special requirements |
| 1.3 | Telecommunications |
| 2 | STABILITY |
| 2.1 | Static loads |
| 2.2 | Dynamic loads |
| 3 | COMFORT |
| 3.1 | Heat comfort |
| 3.1.1 | Air temperature |
| 3.1.2 | Temperature of surrounding areas |
| 3.1.3 | Air movement |
| 3.1.4 | Atmospheric humidity |
| 3.2 | Light |
| 3.2.1 | Light level |
| 3.2.2 | Variations in light level |
| 3.2.3 | Glare |
| 3.2.4 | Light dazzle |
| 3.2.5 | Light colour |
| 3.2.6 | Colour display |
| 3.3 | Psychological comfort |
| 3.3.1 | Individual requirements |
| 3.3.2 | View |
| 3.4 | Hygiene and/or medical aspects |
| 3.4.1 | Air purity |
| 3.4.2 | Acoustics |
| 3.4.3 | Ionization |
| 3.4.4 | Electric field intensity |
| 3.4.5 | Sanitary |
| 3.5 | Contact comfort |
| 3.5.1 | Static electricity |
| 3.5.2 | Surface roughness |
| 3.5.3 | Surface temperature |
| 4 | SAFETY AND SECURITY |
| 4.1 | Fire prevention |
| 4.1.1 | Fire detection and alarm |
| 4.1.2 | Fire-fighting |
| 4.2 | Burglary |
| 4.2.1 | Protection |
| 4.2.2 | Detection and alarm |
| 4.2.3 | Reaction time |
| 4.2.4 | Action |
| 4.3 | Access control |
| 4.3.1 | Visitors |
| 4.3.2 | Staff |
| 4.4 | Lightning arrester |

TABLE 2-continued

CONSTRUCTION PROGRAM
LIST OF PERFORMANCE CHARACTERISTICS

| | |
|---|---|
| 4.5 | Earthing |
| 4.6 | Protection of electronic communication |

TABLE 3

Surface standards in accordance with NEN 2580

Note: The primary and secondary net areas are not included in NEN 2580, but are added in order to clarify the conversion of the square mentioned in the spatial requirement diagrams to gross floor area.

TABLE 4

STABU codes

| Description | Stabu_code | Layer No. | Colour No. |
|---|---|---|---|
| Passages | | 1 | 1 |
| Temporary facilities | 001000 | 5 | 5 |
| Site | 100000 | 6 | 6 |
| Paved site | 110000 | 7 | 7 |
| Unpaved site | 120000 | 8 | 8 |
| Drainage ditch | 130000 | 9 | 9 |
| Structure | 140000 | 10 | 10 |
| | | 11 | |
| | | 12 | |
| Outside sewerage | 151000 | 13 | 13 |
| Drainage | 151200 | 14 | 14 |
| Water removal | 151300 | 15 | 15 |
| Water pipe network | 152100 | 16 | 16 |
| Gas pipe network | 152200 | 17 | 17 |
| Oil pipe network | 152300 | 18 | 18 |
| Town management network | 152400 | 19 | 19 |
| Electrical line network site | 153100 | 20 | 20 |

TABLE 4-continued

STABU codes

| Description | Stabu_code | Layer No. | Colour No. |
|---|---|---|---|
| Information network site | 153200 | 21 | 21 |
| Site illumination | 154000 | 22 | 22 |
| Building/object illumination | 154100 | 23 | 23 |
| Site illumination installation | 154200 | 24 | 24 |
| Advertising/decorative illumination | 154400 | 25 | 25 |
| Site noise installation | 155100 | 26 | 26 |
| Signalling lighting | 156100 | 27 | 27 |
| Security installation | 156200 | 28 | 28 |
| | | 29 | |
| | | 30 | |
| Site fencing | 171000 | 31 | 31 |
| Site buildings | 172000 | 32 | 32 |
| Site decoration | 173000 | 33 | 33 |
| Site furnishing | 174000 | 34 | 34 |
| | | 35 | |
| | | 36 | |
| Pile foundation | 211100 | 37 | 37 |
| Point foundation | 211200 | 38 | 38 |
| Earth-/water-retaining wall | 211300 | 39 | 39 |
| Foundation beam/base | 211400 | 40 | 40 |
| Three-dimensional construction part | 212000 | 41 | 41 |
| Two-dimensional construction part | 213000 | 42 | 42 |
| | | 43 | |
| | | 44 | |
| Ground seal | 221100 | 45 | 45 |
| Outside floor on sand | 221200 | 46 | 46 |
| Inside floor on sand | 221300 | 47 | 47 |
| Cantilever floor, external | 222100 | 48 | 48 |
| Cantilevered floor, internal | 222200 | 49 | 49 |
| Secondary floor, external | 223100 | 50 | 50 |
| Secondary floor, internal | 223200 | 51 | 51 |
| Floor opening filling, external | 225100 | 52 | 52 |
| Floor opening filling, internal | 225200 | 53 | 53 |
| | | 54 | |
| | | 55 | |
| | | 56 | |
| External wall | 231100 | 57 | 57 |
| External wall partition | 231200 | 58 | 58 |
| Internal wall | 232100 | 59 | 59 |
| Internal wall partition | 232200 | 60 | 60 |
| Secondary wall, external | 233100 | 61 | 61 |
| Secondary wall, internal | 233200 | 62 | 62 |
| Wall opening filling, external | 234100 | 63 | 63 |
| Wall opening filling, internal | 234200 | 64 | 64 |
| Balustrade, guide rail element | 235000 | 65 | 65 |
| Sun protection/outside wall protection | 236100 | 66 | 66 |
| Moveable wall, external | 237100 | 67 | 67 |
| Moveable wall, internal | 237200 | 68 | 68 |
| | | 69 | |
| | | 70 | |
| Sloping roof | 241000 | 71 | 71 |
| Sloping roof opening filling | 241200 | 72 | 72 |
| Flat roof | 242000 | 73 | 73 |
| Flat roof opening filling | 242200 | 74 | 74 |
| Canopy | 243000 | 75 | 75 |
| | | 76 | |
| | | 77 | |
| Fixed stair | 251100 | 78 | 78 |
| Moveable stair | 251200 | 79 | 79 |
| Ladder/climbing facility | 251300 | 80 | 80 |
| Stair platform | 251400 | 81 | 81 |
| Sloping path | 252100 | 82 | 82 |
| Sloping path stair | 252200 | 83 | 83 |
| | | 84 | |
| | | 85 | |
| External ceiling | 261100 | 86 | 86 |
| Internal ceiling | 261200 | 87 | 87 |
| Acoustic grating | 262100 | 88 | 88 |
| Baffle | 262200 | 89 | 89 |
| Soundboard | 262300 | 90 | 90 |
| | | 91 | |

TABLE 4-continued

STABU codes

| Description | Stabu_code | Layer No. | Colour No. |
|---|---|---|---|
| | | 92 | |
| Ventilation duct | 271100 | 93 | 93 |
| Gas discharge duct | 271200 | 94 | 94 |
| Chimney | 271300 | 95 | 95 |
| Chute | 272000 | 96 | 96 |
| Pipe duct | 273000 | 97 | 97 |
| Lift shaft | 274000 | 98 | 98 |
| Electrical engineering installation ducts | 275000 | 99 | 99 |
| | | 100 | |
| | | 101 | |
| Sewerage inside building | 311100 | 102 | 102 |
| Rainwater drain | 311200 | 103 | 103 |
| Building drainage | 311300 | 104 | 104 |
| Building water removal | 311400 | 105 | 105 |
| Cold-water tap installation | 312100 | 106 | 106 |
| Hot-water tap installation | 312200 | 107 | 107 |
| Dry fire-extinguishing pipe | 313100 | 108 | 108 |
| Fire-extinguishing water installation | 313200 | 109 | 109 |
| Fire-extinguishing gas installation | 313300 | 110 | 110 |
| Industrial water installation | 314000 | 111 | 111 |
| Natural gas installation | 315100 | 112 | 112 |
| Butane/propane installation | 315200 | 113 | 113 |
| Compressed air installation | 315600 | 114 | 114 |
| Vacuum cleaner installation | 316100 | 115 | 115 |
| | | 116 | |
| | | 117 | |
| | | 118 | |
| Mechanical extraction installation | 321100 | 119 | 119 |
| Mechanical ventilation installation | 321200 | 120 | 120 |
| Air heating installation | 321300 | 121 | 121 |
| Air-conditioning installation | 321400 | 122 | 122 |
| Hot-water heating installation | 322100 | 123 | 123 |
| Steam heating installation | 322200 | 124 | 124 |
| Heat-transfer oil heating installation | 322300 | 125 | 125 |
| Cooling installation | 323000 | 126 | 126 |
| | | 127 | |
| | | 128 | |
| Combined heating and power installation | 330000 | 129 | 129 |
| | | 130 | |
| | | 131 | |
| High-voltage installation | 341100 | 132 | 132 |
| Three-phase low-voltage installation | 341200 | 133 | 133 |
| Single-phase low-voltage installation | 341300 | 134 | 134 |
| Very-low-voltage installation | 341500 | 136 | 136 |
| Emergency power supply installation | 342100 | 137 | 137 |
| No-break installation | 342200 | 138 | 138 |
| Earthing installation | 348100 | 139 | 139 |
| Lightning arrester installation | 348200 | 140 | 140 |
| | | 141 | |
| | | 142 | |
| | | 143 | |
| General lighting installation | 351000 | 144 | 144 |
| Night lighting installation | 352000 | 145 | 145 |
| Advertising lighting installation | 353100 | 146 | 146 |
| Security lighting installation | 353200 | 147 | 147 |
| Orientation lighting installation | 353300 | 148 | 148 |
| Accent lighting installation | 353400 | 149 | 149 |
| Building sides lighting installation | 353500 | 150 | 150 |
| Emergency lighting installation, decentralized | 358100 | 151 | 151 |
| Emergency lighting installation, centralized | 358200 | 152 | 152 |
| | | 153 | 153 |
| | | 154 | 154 |
| Telephone installation | 361100 | 155 | 155 |
| Data communications installation | 361200 | 156 | 156 |
| Intercom installation | 361300 | 157 | 157 |
| Communal antenna installation | 362100 | 158 | 158 |
| Private antenna installation | 362200 | 159 | 159 |
| Radio/mobile phone installation | 362300 | 160 | 160 |
| Bell installation | 363100 | 161 | 161 |
| Time signalling installation | 363200 | 162 | 162 |
| Nurse call installation | 363300 | 163 | 163 |
| Broadcasting installation | 364100 | 164 | 164 |
| Conference/meeting installation | 364200 | 165 | 165 |
| Projection installation | 365100 | 166 | 166 |
| Television monitor installation | 365200 | 167 | 167 |
| | | 168 | |
| | | 169 | |
| Climate control installation | 371100 | 170 | 170 |
| Optimization installation | 371200 | 171 | 171 |
| Video monitoring installation | 372100 | 172 | 172 |
| Signalling installation | 372200 | 173 | 173 |
| Operating installation | 372300 | 174 | 174 |
| Building management installation | 373100 | 175 | 175 |
| | | 176 | |
| | | 177 | |
| Electrical people-carrying lift installation | 381100 | 178 | 178 |
| Hydraulic people-carrying lift installation | 381200 | 179 | 179 |
| Electrical goods lift installation | 381300 | 180 | 180 |
| Hydraulic goods lift installation | 381400 | 181 | 181 |
| Service lift installation | 381500 | 182 | 182 |
| Book lift installation | 381600 | 183 | 183 |
| Roof carriage/cradle installation | 382100 | 184 | 184 |
| Roof crane/cradle installation | 382200 | 185 | 185 |
| Building sides carriage/cradle installation | 382300 | 186 | 186 |
| Roof beam/cradle installation | 382400 | 187 | 187 |
| Roof hook/cradle installation | 382500 | 188 | 188 |
| Crane installation | 383000 | 189 | 189 |
| Lifting platform installation | 384100 | 190 | 190 |
| Dock leveller installation | 384200 | 191 | 191 |
| Stairlift installation | 384300 | 192 | 192 |
| Escalator/travellator installation | 385000 | 193 | 193 |
| Belt/chain conveyor installation | 386000 | 194 | 194 |
| Pipe conveyor installation | 387000 | 195 | 195 |
| | | 196 | |
| | | 197 | |
| Operating installation | 400000 | 198 | 198 |
| | | 199 | |
| | | 200 | |
| | | 201 | |
| Light-regulating blind | 511100 | 202 | 202 |
| Curtain | 511200 | 203 | 203 |
| | | 204 | |
| | | 205 | |
| Cabinet/display case | 521100 | 206 | 206 |
| Storage racks | 521200 | 207 | 207 |
| Cloakroom arrangement | 521300 | 208 | 208 |
| Bicycle stand/rack | 521400 | 209 | 209 |
| Storage tank | 521800 | 210 | 210 |
| Kitchen arrangement | 522100 | 211 | 211 |
| Sink unit | 522200 | 212 | 212 |
| Refreshment bar | 522300 | 213 | 213 |
| Worktop | 522400 | 214 | 214 |
| Counter | 522500 | 215 | 215 |
| Nameplate | 523100 | 216 | 216 |
| Signposting | 523200 | 217 | 217 |
| Flag pole | 524100 | 218 | 218 |
| | | 219 | |
| | | 220 | |
| Toilet | 531100 | 221 | 221 |
| Urinal | 531200 | 222 | 222 |
| Sink/washbasin | 531300 | 223 | 223 |
| Washbowl/fountain | 531400 | 224 | 224 |

TABLE 4-continued

STABU codes

| Description | Stabu_code | Layer No. | Colour No. |
|---|---|---|---|
| Bath | 531500 | 225 | 225 |
| Shower | 531600 | 226 | 226 |
| Bidet | 531700 | 227 | 227 |
| Sanitary fittings | 531800 | 228 | 228 |
| Stove | 532100 | 229 | 229 |
| Air conditioner | 532200 | 230 | 230 |
| Room cooler | 532300 | 231 | 231 |
| Fan | 532400 | 232 | 232 |
|  |  | 233 |  |
|  |  | 234 |  |
| Container | 541100 | 235 | 235 |
| Fire-extinguisher | 541200 | 236 | 236 |
| Furnishings | 542000 | 237 | 237 |
|  |  | 238 |  |
|  |  | to |  |
|  |  | 255 |  |
| Auxiliary segments |  | 256 | 256 |

What is claimed is:

1. A simulation device for generating images of at least one building, comprising:

a display for displaying the images;

an input unit for a user to input data;

a memory; and a processor that is connected to the display, the input unit and the memory, the processor being designed to store in the memory, on the basis of instructions input by the user via the input unit, at least the following data structures:

a first memory field comprising data relating to a layout of the at least one building, which layout comprises a series of types of utility spaces and their three-dimensional positioning with respect to one another within the building, each type of utility space comprising one or more utility spaces, each utility space comprising a reference to one or more performance cards belonging to the utility space, each performance card being defined as a sum of data relating to a specified performance characteristic;

a second memory field comprising data relating to references to component positions, which define locations of the components within the building, and each component position containing a reference to a component card which is defined as a sum of data which comprise material properties, planning data, investment cost data and running cost data relating to a component situated at a component position;

the processor also being designed to:

compute at least one of simulated elevations of and sections through the building and to show them on the display; and calculate the total expected investment costs and running costs by summing investment cost data and running cost data of the components and to show these costs on the display;

wherein each utility space is defined as a required three-dimensional air volume only, for a specified application during use, such utility spaces also being defined for all physical components to be installed in said at least one building, and a model is defined as the layout of utility spaces and all the components forming the building, said model containing said references to said component positions.

2. The simulation device according to claim 1, which is provided with a memory for storing data relating to the at least one building with respect to at least one of the following three phases:

a) a first phase relating to preparation of reconstruction of the at least one building;

b) a second phase relating to the construction of the at least one building;

c) a third phase relating to running of the at least one building after construction has been completed.

3. The simulation device according to claim 1, in which the processor is designed to calculate possible overlapping utility spaces defined in the layout and, if overlapping utility spaces are found, to generate a warning signal.

4. The simulation device according to claim 1, in which the processor is designed to calculate performance characteristics of each utility space from the material properties of the components specified in the component cards relating to the utility space in question, and check whether specified performance characteristics can be met.

5. The simulation device according to claim 1, in which the processor is designed to generate a three-dimensional display, comprising successive images of elevations of the at least one building over the course of time, for display via the display.

6. The simulation device according to claim 2, in which the simulation device is arranged for simulation facility management and in which the data comprise execution and maintenance planning data relating to the layout of the at least one building, which planning data relate to execution and maintenance activities specified for the layout over the course of time.

7. A simulation device for generating images of at least one building, comprising:

a display for displaying the images;

an input unit for a user to input data;

a memory; and a processor that is connected to the display, the input unit and the memory, the processor being designed to store in the memory, on the basis of instructions input by the user via the input unit, at least the following data structures:

a first memory field comprising data relating to a layout of the at least one building, which layout comprises a series of types of utility spaces and their three-dimensional positioning with respect to one another within the building, each type of utility space comprising one or more utility spaces, each utility space comprising a reference to one or more performance cards belonging to the utility space, each performance card being defined as a sum of data relating to a specified performance characteristic;

a second memory field comprising data relating to references to component positions, which define locations of the components within the building, and each component position containing a reference to a component card which is defined as a sum of data which comprise material properties, planning data, investment cost data and running cost data relating to a component situated at a component position;

the processor also being designed to:

compute at least one of simulated elevations of and sections through the building and to show them on the display; and calculate the total expected investment costs and running costs by summing investment cost data and running cost data of the components and to show these costs on the display;

wherein each utility space is defined as a required three-dimensional air volume only, for a specified application during use, such utility spaces also being defined for all physical components to be installed in said at least one building, and a model is defined as the layout of utility spaces and all the components forming the building, said model containing said references to said component positions, and wherein the data comprise execution and maintenance planning data relating to one of the components and the layout of the at least one building, which planning data relate to execution and maintenance activities specified for the one of the components and the layout in the course of time.

* * * * *